(12) United States Patent
De Gouy et al.

(10) Patent No.: US 7,002,380 B2
(45) Date of Patent: Feb. 21, 2006

(54) FREQUENCY DIVIDER WITH FUNNEL STRUCTURE

(75) Inventors: Jean-Luc De Gouy, Briis sous Forges (FR); Pascal Gabet, Cholet (FR); Gilles Neveu, Sannois (FR)

(73) Assignee: Thales, Neuilly sur Seine (FR)

( * ) Notice: Subject to any disclaimer, the term of this patent is extended or adjusted under 35 U.S.C. 154(b) by 0 days.

(21) Appl. No.: 10/772,584

(22) Filed: Feb. 6, 2004

(65) Prior Publication Data

US 2004/0222825 A1 Nov. 11, 2004

(30) Foreign Application Priority Data

Feb. 7, 2003 (FR) .................................. 03 01485

(51) Int. Cl.
*H03K 21/00* (2006.01)
(52) U.S. Cl. .................................... 327/115; 327/117
(58) Field of Classification Search ........ 327/115–122; 377/47, 48
See application file for complete search history.

(56) References Cited

U.S. PATENT DOCUMENTS 4,011,516 A * 3/1977 Heimbigner et al. ........ 327/114
4,179,670 A * 12/1979 Kingsbury .................... 331/10
4,815,018 A * 3/1989 Reinhardt et al. .......... 708/101
5,867,068 A * 2/1999 Keating ...................... 331/1 A
5,878,101 A * 3/1999 Aisaka ......................... 377/47
6,035,182 A 3/2000 Shurboff .................... 327/117
6,369,623 B1 4/2002 Heinen ....................... 327/117

* cited by examiner

*Primary Examiner*—Timothy P. Callahan
*Assistant Examiner*—An T. Luu
(74) *Attorney, Agent, or Firm*—Lowe Hauptman & Berner, LLP

(57) ABSTRACT

In a frequency divider enabling the division by N of a frequency Fe and comprising at least one prescaler followed by a division chain, the prescaler has at least one input for the frequency signal Fe to be divided, one input for a command NA of the basic division rank of the prescaler and one input for a command ΔNA coming from the division chain and enabling NA to be made to vary by one unit; the division chain comprises at least one division stage (K) comprising at least one divider by 2, giving a divided frequency F(K), a switch controlled by the divider by 2, the switch having one input for a piece of programming data R(K), one input for the carry signal RX(K+1) of the next stage and one output for the carry signal RX(K) for the previous stage. Application to the field of phase-locked loop frequency synthesis.

11 Claims, 12 Drawing Sheets

FIG.4

| | | F3 = HIGH | | | | F3 = LOW | | | |
|---|---|---|---|---|---|---|---|---|---|
| RX3 | STATE OF F3 | HIGH | | | | LOW | | | |
| | VALUE | R3 | | | | RX4 | | | |
| RX2 | STATE OF F2 | HIGH | | LOW | | HIGH | | LOW | |
| | VALUE | R2 | | R3 | | R2 | | RX4 | |
| RX1 | STATE OF F1 | HIGH | LOW | HIGH | LOW | HIGH | LOW | HIGH | LOW |
| | VALUE | R1 | R2 | R1 | R3 | R1 | R2 | R1 | RX4 |
| F0 | DURATION/Te HIGH STATE + LOW STATE | 1+R1 | 1+R2 | 1+R1 | 1+R3 | 1+R1 | 1+R2 | 1+R1 | 1+RX4 |
| F1 | STATE | HIGH | LOW | HIGH | LOW | HIGH | LOW | HIGH | LOW |
| | DURATION/Te | 2+R1+R2 | | 2+R1+R3 | | 2+R1+R2 | | 2+R1+RX4 | |
| F2 | STATE | HIGH | | LOW | | HIGH | | LOW | |
| | DURATION/Te | 4+2R1+R2+R3 | | | | 4+2R1+R2+RX4 | | | |
| F3 | STATE | HIGH | | | | LOW | | | |
| | DURATION/Te | 8+4R1+2R2+R3+RX4 | | | | | | | |
| DURATION/Te OF THE FRAME | | 8+4R1+2R2+R3+RX4 | | | | | | | |

FREQUENCY DIVIDER WITH FUNNEL STRUCTURE

BACKGROUND OF THE INVENTION

1. Field of the Invention

The object of the invention relates to a frequency divider.

It relates especially to a multi-octave frequency divider with a structure known as a funnel structure and a synchronous output.

It can be applied in the field of frequency synthesis and more particularly in the field of phase-locked loop frequency synthesis.

It can also constitute a basic cell of a programmable digital component of the FPGA (Field Programmable Gate Array) and DSP (Digital Signal Processing) type.

It can also be used for pulse generators with very low jitter.

2. Description of the Prior Art

FIG. 1 shows an exemplary prior art divider.

It is formed by a prescaler 1 that divides the input frequency Fe by Na or by Na+1, a first counter A, referenced 2, whose output TC controls the division of the prescaler by Na or by Na+1, a second counter B, referenced 3, whose output TC is the output of the divider.

The assembly works as follows: when the counter B reaches the end of the counting stage (which corresponds to the end of a frame), it delivers the signal TC which respectively reloads the two counters with the values A and B, in complying with B≧A. A new frame then starts. So long as the counter A has not finished counting, the prescaler 1 divides the input frequency Fe by Na+1. This means that whenever A and B are counted down by one unit, the prescaler 1 counts (Na+1) cycles of the input signal with a period Te. The counter A therefore reaches the end of counting at the end of A*(Na+1) cycles with a duration Te. At this point in time, the counter A stops and orders the prescaler to perform a division by Na. To reach the end of counting, the counter B must again count B−A, which corresponds to Na*(B−A) cycles of the input signal. The device then returns to the initial state.

The total number of cycles of the input signal during a frame gives the division rank N of the divider:

$$N=A(Na+1)+Na(B-A)$$

$$N=A+BNa$$

So that N may evolve continuously in steps of 1, A should be programmable between 0 and Na−1. Since B is greater than or equal to A, we have Bmin=Na−1.

Hence Mmin=Na*(Na−1).

For a ⅘ prescaler, the minimum division rank needed to obtain continuity in steps of 1 is therefore equal to 12.

A structure of this kind has especially the following drawbacks:

The counters A and B are synchronous counters for which all the stages must work at a high frequency equal to Fe/Na, For a division rank N varying from a few units to several hundreds of units, these synchronous counters give rise to very high consumption (given a high operating frequency and a large number of stages), It is not easy to implement the fractional modes, The number of logic layers between the input and the output is generally greater, thus limiting the phase noise performance.

SUMMARY OF THE INVENTION

The invention relates to a frequency divider enabling the division by N of a frequency Fe and comprising at least one prescaler followed by a division chain. The invention is characterized in that:

the prescaler has at least one input for the frequency signal Fe to be divided, one input for a command NA of the basic division rank of the prescaler and one input for a command ΔNA coming from the division chain and enabling NA to be made to vary by one unit, the division chain comprises at least one division stage (K) comprising at least one divider by 2, giving a divided frequency F(K), a switch controlled by the divider by 2, the switch having one input for a piece of programming data R(K), one input for the carry signal RX(K+1) of the next stage and one output for the carry signal RX(K) for the previous stage.

Should there be a single stage, the carry signal RX(K) is a command ΔNA.

The command NA of the division rank varies from N0 to 2*N0−1 where N0 is the minimum rank of the prescaler and a command ΔNA is equal to NA+1 in order to increment the division rank NA by one unit. N0 is for example of power of 2 and the command NA varies for example from $2^P$ to $2^{(P+1)}-1$.

The device according to invention has especially the following advantages:

the speed performance depend solely on the front-end stage: in other words the division rank N can be extended (to infinity) without diminishing, the operating frequency of the divider assembly, the structure of the divider according to the invention makes it possible to obtain the function equivalent to the division by a synchronous counter, and this is the case whatever the counting length, the device can be easily implemented in a discrete digital component or else an FPGA or ASIC type integrated logic, it improves the performance of fractional-step PLL synthesizers, the cyclical ratio of the output signal is 50% when the division rank N is an even-parity value and is the value closest to 50% when the division rank is an odd-parity value.

BRIEF DESCRIPTION OF THE DRAWINGS

Other features and advantages of the invention shall appear more clearly from the following description of a detailed example that in no way restricts the scope of the invention, and from the appended figures of which FIG. 1 exemplifies an architecture of a prior art frequency divider, FIG. 2 exemplifies a basic architecture of a frequency divider according to the invention, FIG. 3 exemplifies an implementation of the divider according to the invention, FIG. 4 is a table showing the propagation of the carry values and the duration of the high and low states for the example of FIG. 3, FIGS. 5A and 5B show an exemplary embodiment comprising a synchronous output and the associated timing diagram, FIG. 6 exemplifies an embodiment of the synchronous output by means of a JK flip-flop circuit, FIG. 7 exemplifies an embodiment of the synchronous output with a choice of polarity.

MORE DETAILED DESCRIPTION

In the present invention, the term "prescaler" designates a divider placed at the front end of a division chain, generally having a simple structure and working at high speed.

Any other device having functional characteristics that are identical or substantially identical with this prescaler may be used.

Figure 2:
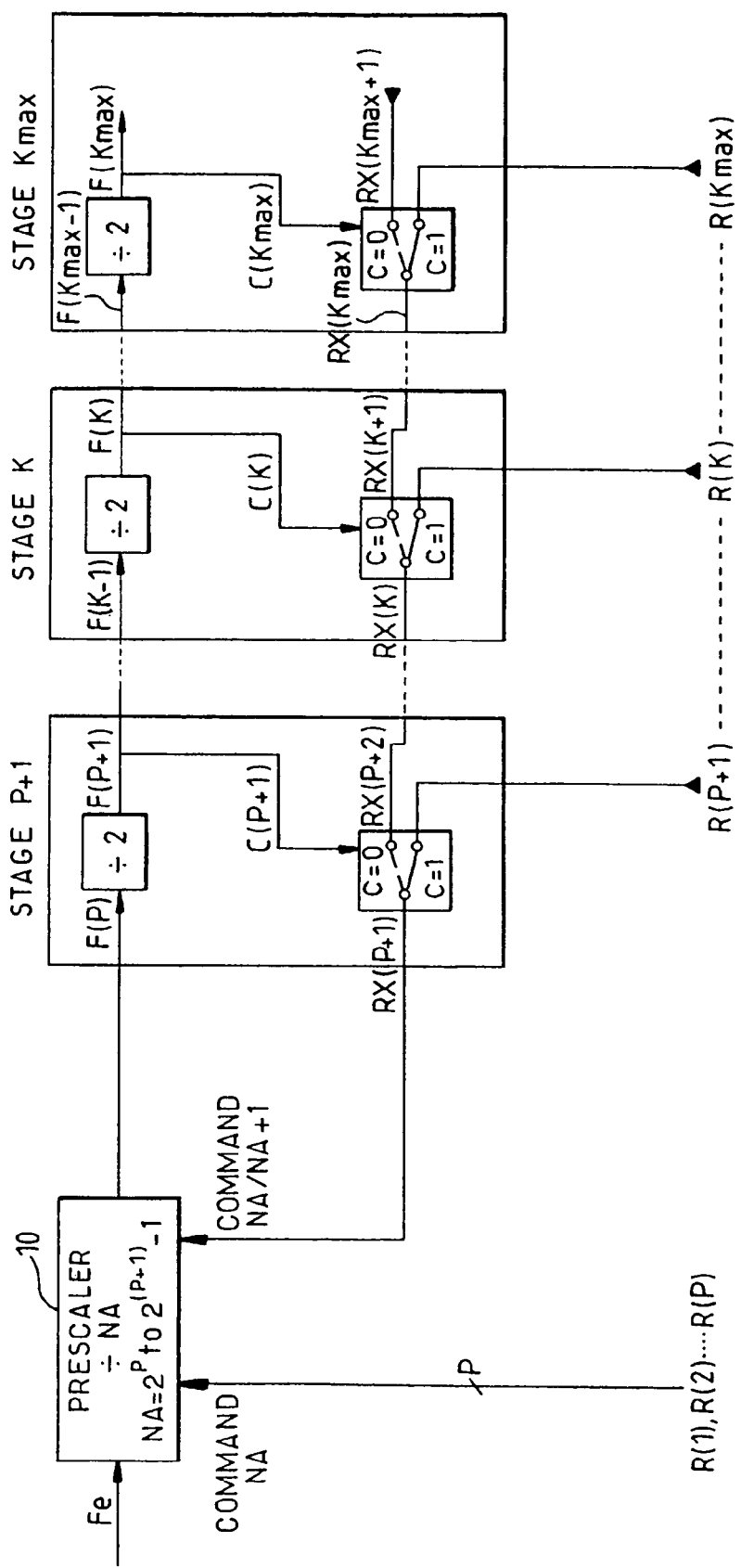

FIG. 2 exemplifies an embodiment of a frequency divider according to the invention.

It comprises for example a prescaler 10 whose division rank NA varies on one octave or substantially on one octave. The prescaler has one input which receives the signal to be divided Fe, one input for a command NA of the basic division rank of the prescaler, one input for a command NA/(NA+1) (making it possible to obtain a one-unit variation in the division rank of the prescaler, for example enabling it to be incremented by one unit) coming from a module 11 comprising one or more identical or substantially identical division stages.

The prescaler has, for example, a division rank NA varying from N0 to 2*N0−1 where N0 is the minimum rank of the prescaler.

In the example given here below by way of an illustration that in no way restricts the scope of the invention, NA may assume the values $2^P$ to $2^{(P+1)}-1$ depending on the value of the control word of the division rank NA, referenced 12 and represented by the bits R(1), R(2) ... R(P). Furthermore, a command NA/NA+1, referenced 13, which comes from the next division stage, enables division by NA or NA+1 depending on the value 0 or 1 of the command. (The value of P is chosen for example so that the prescaler has an optimum critical path).

For P=0, the prescaler is a divider by 1 that receives only the command NA/NA+1 which enables division by 1 or by 2.

For P=1, the prescaler divides by NA=2 or 3 depending on the value of R(1). The command NA/NA+1 makes it possible to obtain variations of 2 to 3 or 3 to 4 depending on the value of R(1).

For P=2, the prescaler divides by NA=4, 5, 6, 7 and the command NA/NA+1 makes it possible to obtain variations of 4/5, 5/6, 6/7 and 7/8. And so on and so forth for the other values of P.

In this example, the prescaler 10 is followed by Kmax−P stages which have an identical or substantially identical function and are series-connected to form the divider. The divider thus formed in this exemplary embodiment enables the division by a rank ranging from $2^{Kmax}$ to $2^{(Kmax+1)}-1$ with a command RX(Kmax+1) that enables the division rank to be augmented by one unit.

A division stage K comprises for example a divider by 2, referenced $14_K$ whose input is F(K−1) (frequency coming from the previous stage K−1) and whose output is F(K), a frequency that corresponds to the input of the following stage (K+1). The stage K also has a two-input switch $15_K$ which is controlled by the output of the divider by 2, $14_K$. A first input of the switch is the carry signal RX(K+1) which comes from the following stage (named (K+1)), and a second input of the switch is the programming data R(K), line $16_K$. The output of the switch $15_K$ is the carry signal RX(K) which is one of the two inputs of the switch $15_{K-1}$ of the stage K−1.

For the stage K=P+1, the output of the switch $15_{P+1}$ is the command NA/NA+1 of the prescaler. The addition of the stage P+1 after the prescaler 10 gives a divider that divides by a programmable rank NA' with a value ranging from $2^{(P+1)}$ to $2^{(P+2)}-1$. This divider has an input RX(P+2) which gives the command NA'/NA'+1. The addition of Kmax−P stages behind the prescaler gives a divider that divides by a programmable rank with a value ranging from $2^{(Kmax)}$ to $2^{(Kmax+1)}-1$. This division rank may be incremented by 1 by the command RX(Kmax+1).

Figure 1:
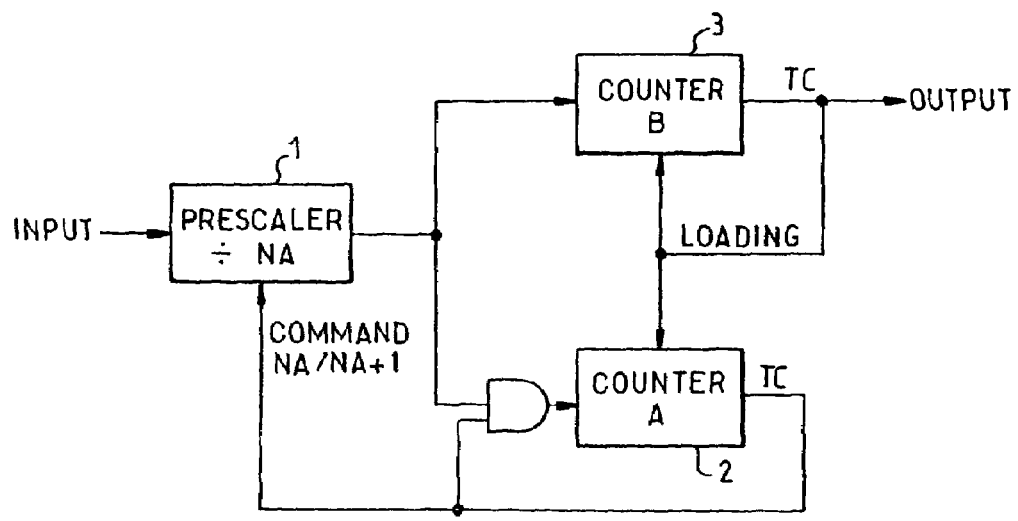
Figure 3:
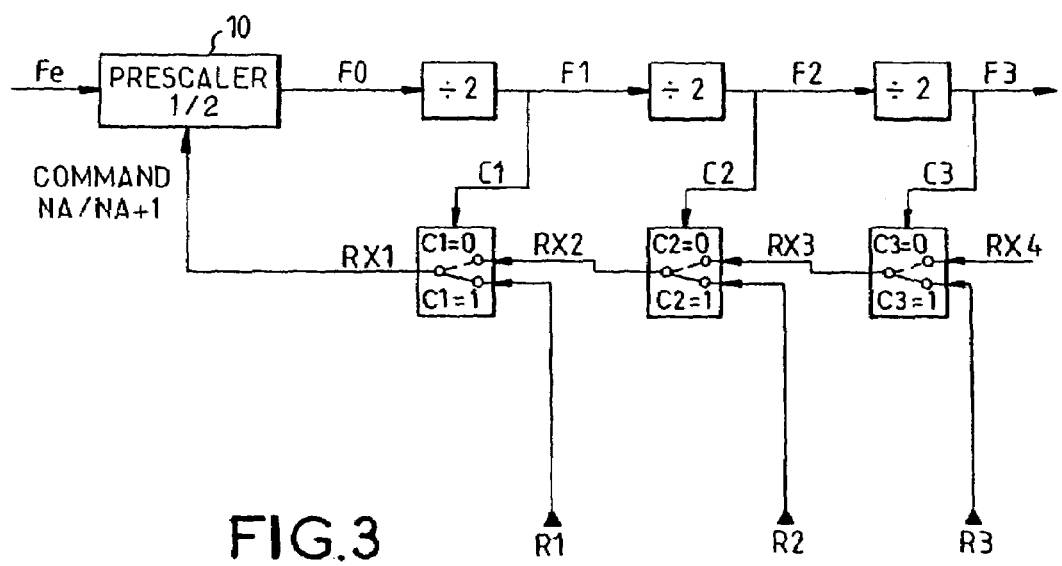

FIG. 3 gives a schematic view of an exemplary divider according to the invention, comprising a ½ prescaler followed by three divide-by-2 stages. The following are the conventions used: the divide-by-2 stages or dividers by 2 ($14_1$, $14_2$, $14_3$) change their state on the leading edge of the input signal ($F_0$, $F_1$, $F_2$), the commands $C_1$, $C_2$, $C_3$ from the switches $15_1$, $15_2$, $15_3$, select the carry values RX2, RX3, RX4 coming from the following state on the low states of the outputs F1, F2, F3 of the divide-by-2 stages.

Other conventions can be used without changing the properties of the divider provided that the following rule is followed: the stage K reads the carry value coming from the stage K+1 on the state of the signal F(K) which is located just before the edge of F(K) which activates the changes in state for the stage K+1.

Since the divider is constituted by the ½ prescaler followed by the division stages $K_1$, $K_2$, $K_3$, the duration of a counting frame of the divider is defined, for example, as the period of time constituted by a high state and a low state of the output signal of the last stage (the stage $K_3$, in this example, and the signal F3).

This counting frame comprises two counting cycles of the stage $K_2$. Each cycle is constituted by a high state and a low state whose durations may be different from one cycle to another, according to the propagation of the carry values RX. The counting frame therefore contains four counting cycles of the stage $K_1$ and eight counting cycles of the prescaler 10.

The counting frame generally contains $2^{(Kmax-P)}$ counting cycles of the prescaler when Kmax−P divide-by-2 stages are cascaded behind the prescaler. Each of these cycles has a duration equal to NA or NA+1 times the period of the input signal Fe.

The duration of these eight counting cycles is obtained by the propagation of the carry values during the counting frame (this propagation is done downstream to upstream). This propagation is represented in table 1 (FIG. 4) by the lines RX3, RX2 and RX1. The signal RX1 having been obtained, the durations of the different states of the signals F0, F1, F2 and F3 are deduced (the deduction is done from upstream to downstream).

Finally, the duration of the counting frame is obtained. This duration is equal to: (8+4R1+2R2+R3+RX4)*Te, where Te is the period of the input signal of the divider.

For a prescaler ½ followed by Kmax divide-by-2 stages, the division rank obtained is:

$$N = 2^{Kmax} + R(1) \cdot 2^{Kmax-1} + R(2) \, 2^{Kmax-2} + \ldots + R(Kmax) + RX(Kmax+1)$$

In taking RX (Kmax+1)=0 (which means that the stage K is the last stage and that it receives no carry value) this division rank is written in binary mode very simply since the MSB is a 1. Then the different bits are R(1), R(2) until R(Kmax) which constitutes the LSB.

Division rank N in binary mode = 1 R (1) R (2) . . . R (Kmax)

This is an advantage of the device. The decoding that enables the commands R(1), R(2) . . . , R(Kmax) to be presented to the different devices is obtained very simply from the binary word presented as a command of the division rank N.

The table (FIG. 4) gives the propagation of the carry values and the duration of the high and low states for a ½ prescaler followed by three stages. The examination of the lines RX3, RX2 and RX1 of this table shows that: in tracing back along the chain of the switches, the carry values (for example R3) are gradually windowed down so that they are presented without the additional glitch that could appear in relation to the logic levels planned at the front-end stage (herein the prescaler). The chain of the switches acts as a "funnel" for the carry values which are gradually "resynchronized" up to the prescaler. This "funnel" stage is used to refine the structure of the divider described here below.

This table 1 (FIG. 4) also reveals that each division stage may tolerate a delay almost equal to the duration of the high state of the input signal of the stage (given the conventions chosen). This means that each stage of the divider can be sized solely for its own working frequency. Such a divider is therefore optimal in terms of consumption.

Figure 5A:
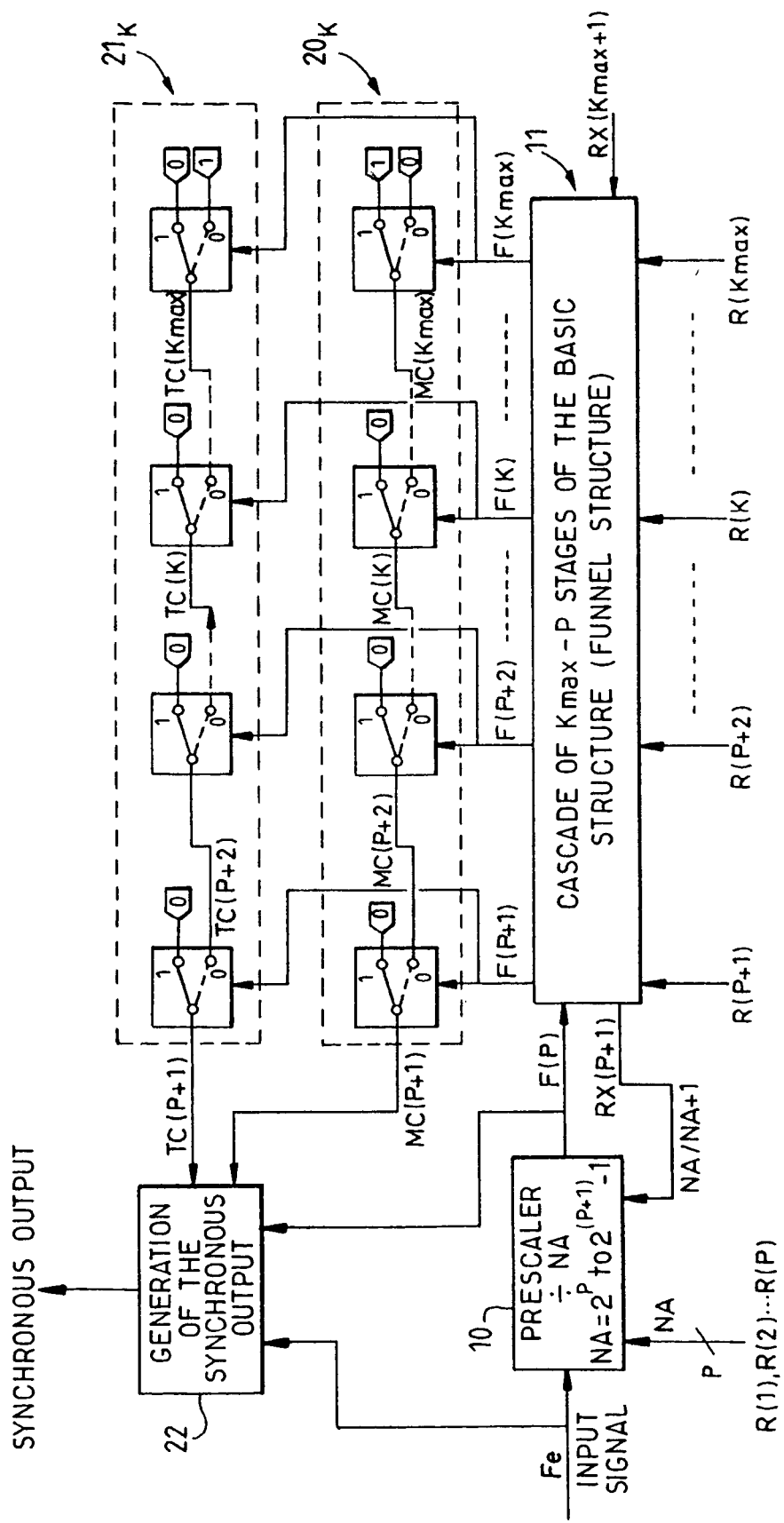

FIG. 5A is a block diagram of an alternative embodiment of a divider comprising a synchronous output. As compared with the structure designated as a basic structure or funnel structure (referenced module 11 in FIG. 2) and described in FIG. 3, the device of the invention comprises the following additional elements:

A first chain of Kmax–P switches $20_K$ controlled by the outputs F(P+1) to F(Kmax) of the different dividers of the funnel structure described in FIG. 2. The output signal of this first chain is a mid-counting signal MC(P+1).

A second chain of Kmax–P switches $21_K$ controlled by the outputs F(P+1) to F(Kmax) of the different dividers of the funnel structure. The output signal of this second signal is an end-of-counting signal TC(P+1).

A module 22 for the generation of a synchronous output. This output is prepared from the signals TC(P+1) and/or MC(P+1) and the clock signals F(P) and/or Fe. Indeed, several types of synchronous output are possible depending on the application envisaged.

The structure shown in FIG. 5A enables the division rank N to be changed statically (this means that there is a period of reconfiguration time during which the output signal cannot be exploited). This change is made by modifying the values R(K): a rank N is then obtained. This rank N may vary between $2^{Kmax}$ and $2^{Kmax+1}$. Furthermore, by statically managing the number of active stages of the funnel structure (for example by not feeding the unused stages) it is possible to make N vary by $2^{P+1}$ to $2^{Kmax+1}$.

Figure 5B:
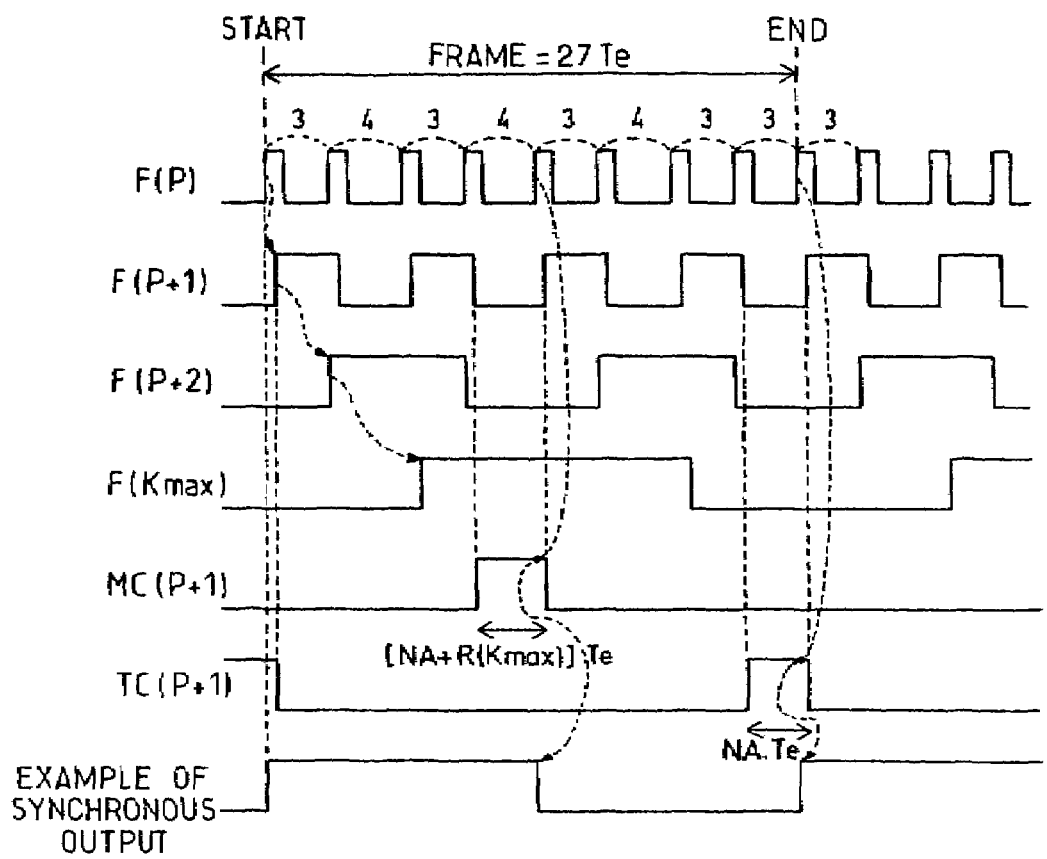

FIG. 5B gives a schematic view of a timing diagram of the signals comprising TC(P+1), MC(P+1) for a division by 27 with NA=3, P=1 and Kmax=3. In this example, the instant of the start of a frame is defined so as to identify the signals TC(P+1) and MC(P+1) relative to this start of a frame. The start of a frame designates the edge of the signal F(P) (input signal of the funnel structure) that activates the cascaded passage to 1 of all the dividers by 2 of the funnel structure, given the conventions chosen.

This definition is found in the timing diagrams of this FIG. 5B where the start of the frame is the leading edge of F(P) which activates the passage to 1 of F(P+1) and then of F(P+2) up to F(Kmax).

In this exemplary implementation, the chains of the switches delivering TC(P+1) and MC(P+1) are provided at their inputs with logic levels used to obtain only one pulse per frame for each chain. This pulse is windowed down by F(P+1); hence it is synchronous with F(P+1) and has a duration equal to one cycle of the prescaler. The pulse TC(P+1) selects:

Either the edge of F(P) corresponding to the end of frame,
Or the edge of F(P) shifted relative to the end of a frame provided that the shift has a constant duration whatever the value of the pieces of programming data R(1) to R(Kmax).

The pulse MC(P+1) selects the edge of F(P) neighboring the middle of the frame.

Thus, in selecting the appropriate transitions of F(P), the signals TC(P+1) and MC(P+1) make it possible to generate a signal that is the image of the output signal of the funnel F(P). Such a structure especially has the following advantages:

The possibility of obtaining a synchronous divider, whatever the number of stages of the structure and hence whatever the division rank, The possibility of obtaining an output signal whose phase noise is very close to that of the input signal of the divider, whatever the number of stages of the structure and, hence, whatever the division rank. Indeed, the number of logic layers between the input Fe and the synchronous output is minimized. This small number of layers can also be optimized in terms of noise. With a low-ranking prescaler, the resynchronization is done by Fe and the number of logic layers between the input and the synchronous output is equal to 1.

One way to obtain the signal TC(K) that represents the end of counting of the stage K is to:

Adopt the same convention as that of the funnel structure for the selection of the carry values coming from the stage K+1 on the low states of F(K),
Position the input of the last switch selected by the low state of F(Kmax) at 1,
Position the input of the last switch selected by the high state of F(Kmax) at 0,
Position all the switch inputs selected by the high state of F(P+1), F(P+2) . . . F(Kmax-1) at 0.

One way to obtain MC(K) is to:

Adopt the same convention as that of the funnel structure for the selection of the carry values coming from the stage K+1 on the low states of F(K),
Position the input of the last switch selected by the high state of F(Kmax) at 1, Position the input of the last switch selected by the low state of F(Kmax) at 0, Position all the switch inputs selected by the high state of F(P+1), F(P+2), . . . F(Kmax) at 0.

Different types of synchronous output, some examples of which are given here below, can be envisaged.

Figure 6:
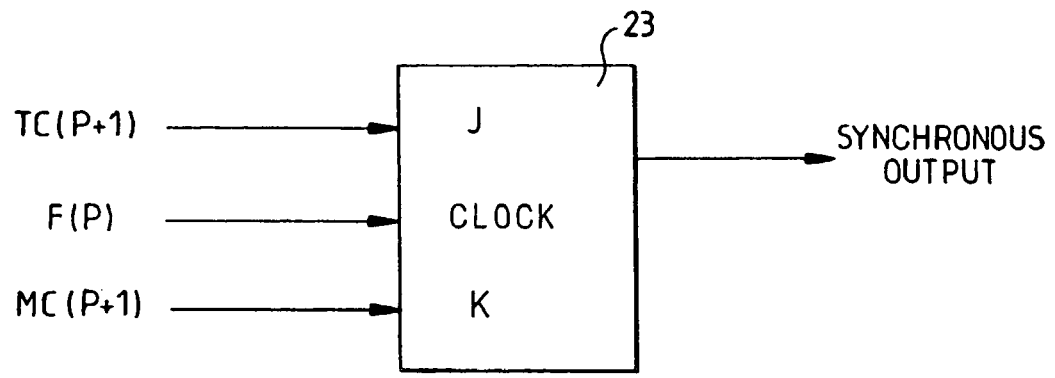

The first type, shown schematically in FIG. 6, is a synchronous output which is identical to F(Kmax). In this case, the signals MC(P+1) and TC(P+1) are used. These signals may, for example, be combined on a JK flip-flop circuit referenced 23. The clock of the JK flip-flop circuit is generally F(P) and Fe for a low-ranking prescaler.

Figure 7:
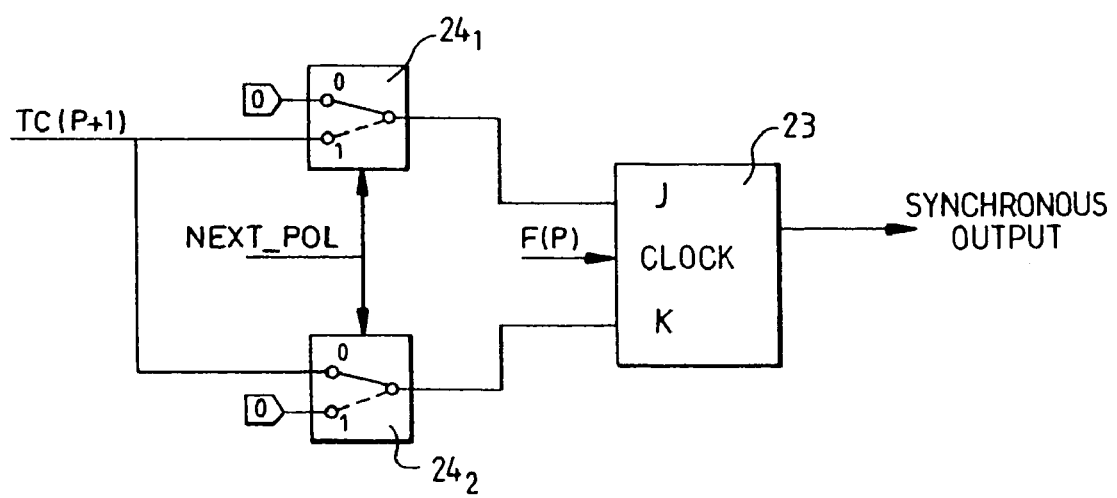

A second type of synchronous output is given in FIG. 7. It consists especially in generating a constant state throughput the duration of the frame and in choosing a control signal NEXT_POL (next polarity control signal that enables the choosing of a polarity of 0 or 1 of the synchronous output for the next frame with a constant level on one frame). Two switches $24_1$ and $24_2$ each receive a signal TC(P+1) and NEXT_POL and are positioned just before the JK flip-flop circuit referenced 23. In this type of synchronous output, it is only the signal TC(P+1) that is used. This alternative embodiment may also use any other type of flip-flop circuit.

A third type of synchronous output (not shown in the figures) consists especially in sending the output TC(P+1) to the J and K inputs so as to alternatively obtain a high state and a low state, each state having the duration given by N*Te where Te is the input period of the clock and N is the overall division rank.

The synchronous output shown in FIGS. 5A to 8 is a resynchronization on F(P) which is the output of the prescaler or on Fe which is the input of the prescaler. A resynchronization on the input Fe of the prescaler gives improved phase noise performance.

The basic signals for performing this resynchronization optimally are:

TC(P+1) resampled by F(P),
MC(P+1) resampled by F(P).

Other solutions of resynchronization on Fe can be achieved by imposing operational constraints on the prescaler such as, for example, the constraint of presenting a state of its output cycle with a constant duration. In the device of the invention, the signals TC(P+1), MC(P+1) and RX(P+1) are obtained without additional pulses. This is due to the funnel structure which works with inverse propagation: upstream to downstream for the chain of dividers by 2 and downstream to upstream for the chains RX, TC and MC.

Figure 8:
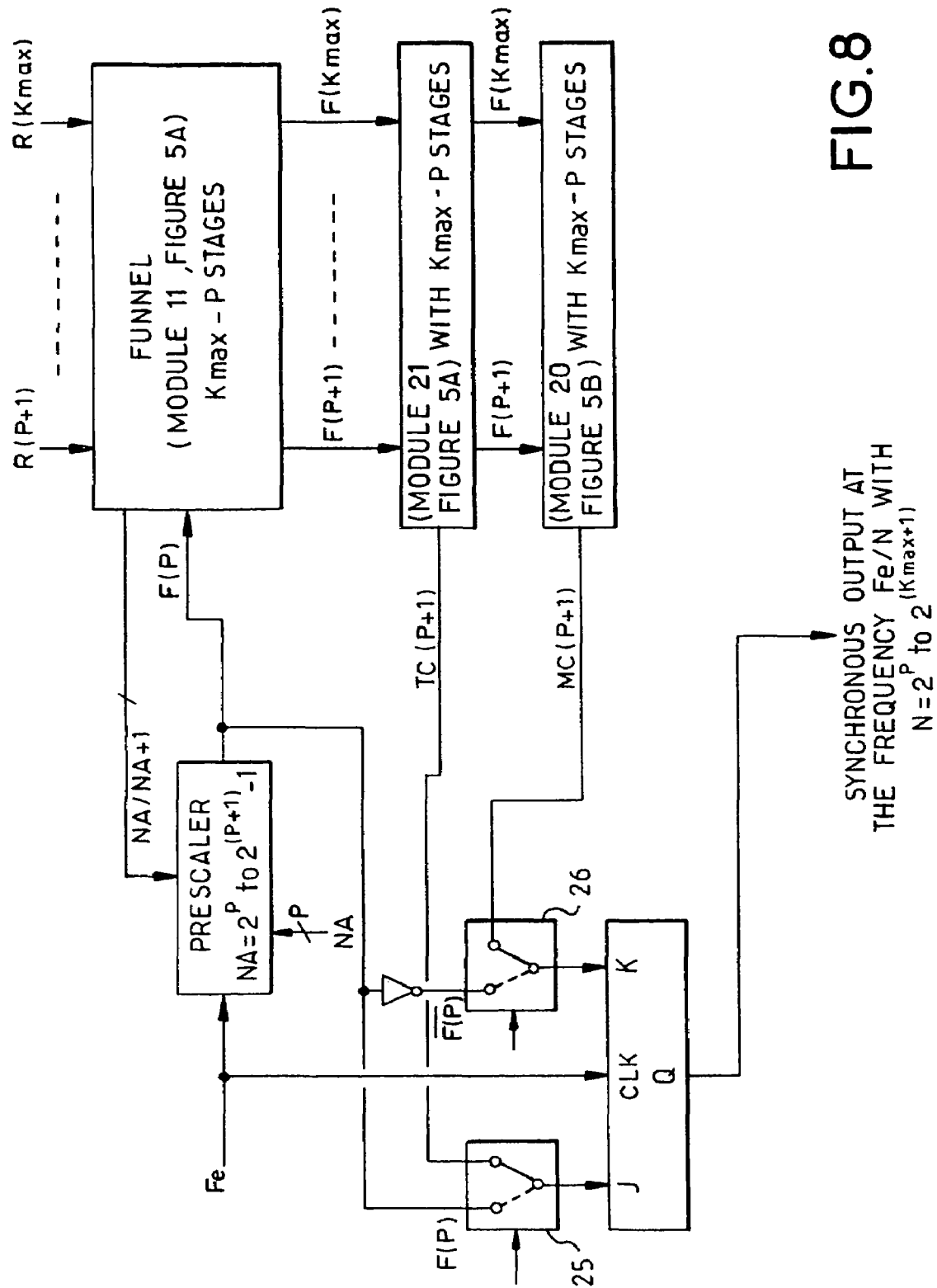
FIG. 8 shows another alternative embodiment, FIG. 9 exemplifies an architecture for changing the division rank.

FIG. 8 shows an alternative embodiment that can be used to obtain a frequency-divided signal Fe/N at the synchronous output, where N may vary statically from $2^P$ to $2^{(Kmax+1)}$.

As compared with the structure described in FIG. 5A, the structure has two switches 25 and 26 which respectively receive the output of the prescaler F(P) and its complementary value $\overline{F(P)}$. The module 22 has a flip-flop circuit 23 which is, for example, a JK type flip-flop circuit. The JK flip-flop circuit, with a synchronous output, is provided at J with the switch 25 that can be used to obtain J=F(P) or J=TC(P+1) and is provided at K with the switch 26 which can be used to obtain K=$\overline{F(P)}$ or K=MC(P+1). With this variant, the N division rank starts at the minimum rank of the prescaler.

Dynamic Changing of the Division Rank

According to the invention, it is possible to choose a new division rank from frame to frame (i.e. with dynamic change).

Figure 9:
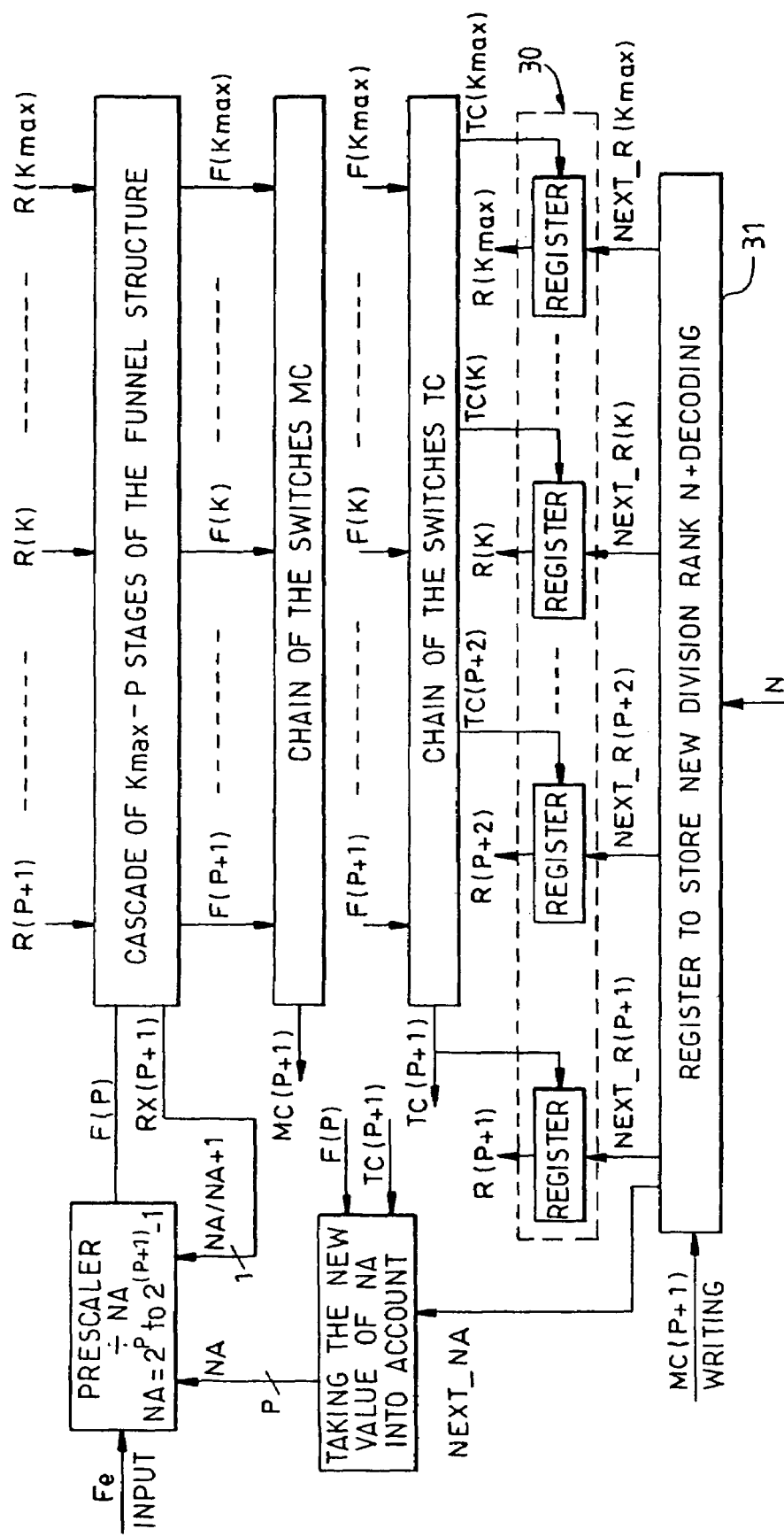

FIG. 9 is a schematic view of an exemplary structure used to carry out the change in division rank from frame to frame, i.e. while a frame is in progress, the division device is given a new division rank for the next frame. This new frame will start as soon as the previous frame ends, to as to achieve perfect continuity.

It comprises a prescaler 10 dividing by NA varying from N0 to 2*N0−1, for example from $2^P$ to $2^{(P+1)}-1$, followed by Kmax−P stages corresponding to the funnel structure (described in detail in FIG. 2) as well a the chains of switches delivering TC(P+1) and MC(P+1) according to the synchronous structure described in FIG. 5A. A first row 30 of registers is controlled by the intermediate outputs of the chain TC and a second row of registers 31 is controlled by the signal MC(P+1).

The new division rank can be taken to account for example as follows:

In the middle of the frame, the signal MC(P+1) takes account of the new division rank for the next frame in storing NEXT_R(1), NEXT_R(2), . . . NEXT_R(Kmax).

When a trace-back is made along the chain of switches TC, the end-of-frame signal successively induces a transition of states of the signals TC(Kmax), TC(Kmax−1), . . . TC(P+1) that enable the transfer of all the NEXT_R(K) values into the corresponding registers R(K). By the very principle of the chain TC, this transfer takes place when the previous R(K) is no longer used by the stage K of the funnel (basic structure shown schematically in FIG. 2).

For the divider according to FIG. 9, it is possible to dynamically switch over the division rank N to an octave of $2^{Kmax}$ to $2^{(Kmax+1)}$.

Figure 10:
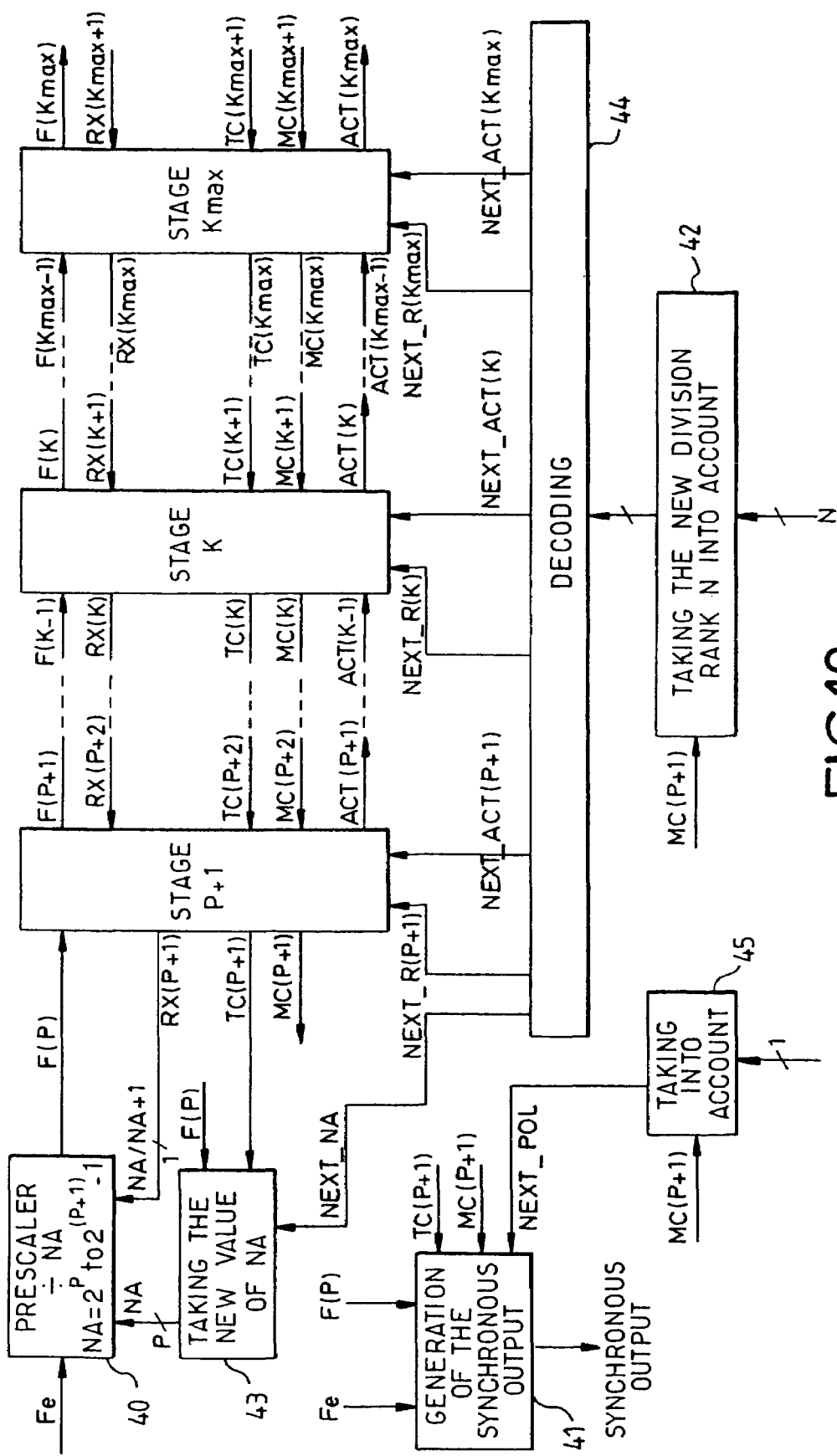
FIG. 10 is a block diagram of a multi-octave divider according to the invention.

FIG. 10 is a block diagram of a multi-octave divider. Such a scheme can be used especially for the dynamic switching of the division rank over several octaves.

The divider comprises for example:

A prescaler 40 whose function is to divide by NA varying from N0 to 2*N0−1, for example from $2^P$ to $2^{(P+1)}-1$ with a command NA/(NA+1), Kmax−P division stages with a identical or substantially identical structure which are cascaded behind the prescaler, A module 41 for the generation of the synchronous output, having a structure identical or substantially identical to the structure described with reference to FIG. 5A, A function 42 for the taking into account in mid-frame of the division rank for the next frame; this function receives the write signal MC(P+1), A function 43 preparing the signal for taking account of the new division rank NA of the prescaler, A decoding function 44 enabling the extraction, from the control word N, of the information NEXT_R(K) (K varies from 1 to Kmax, NEXT_R(K) gives the value of N for the next frame), NEXT_ACT(K) (K varies from P+1 to Kmax, NEXT_ACT(K) indicates whether the stage K is active or not active for the next frame) and NEXT_NA (gives the value of NA of the prescaler for the next frame), If necessary, a function 45 for taking account of the polarity of the synchronous output signal for the next frame.

Such a structure advantageously enables the dynamic management of the counting length and hence makes it possible to obtain a division rank that is switchable from frame to frame, having the value $2^{(P+1)}$ (maximum division rank of the prescaler) and $2^{(Kmax+1)}$ (maximum division rank when all the stages of the device are active).

Figure 11:
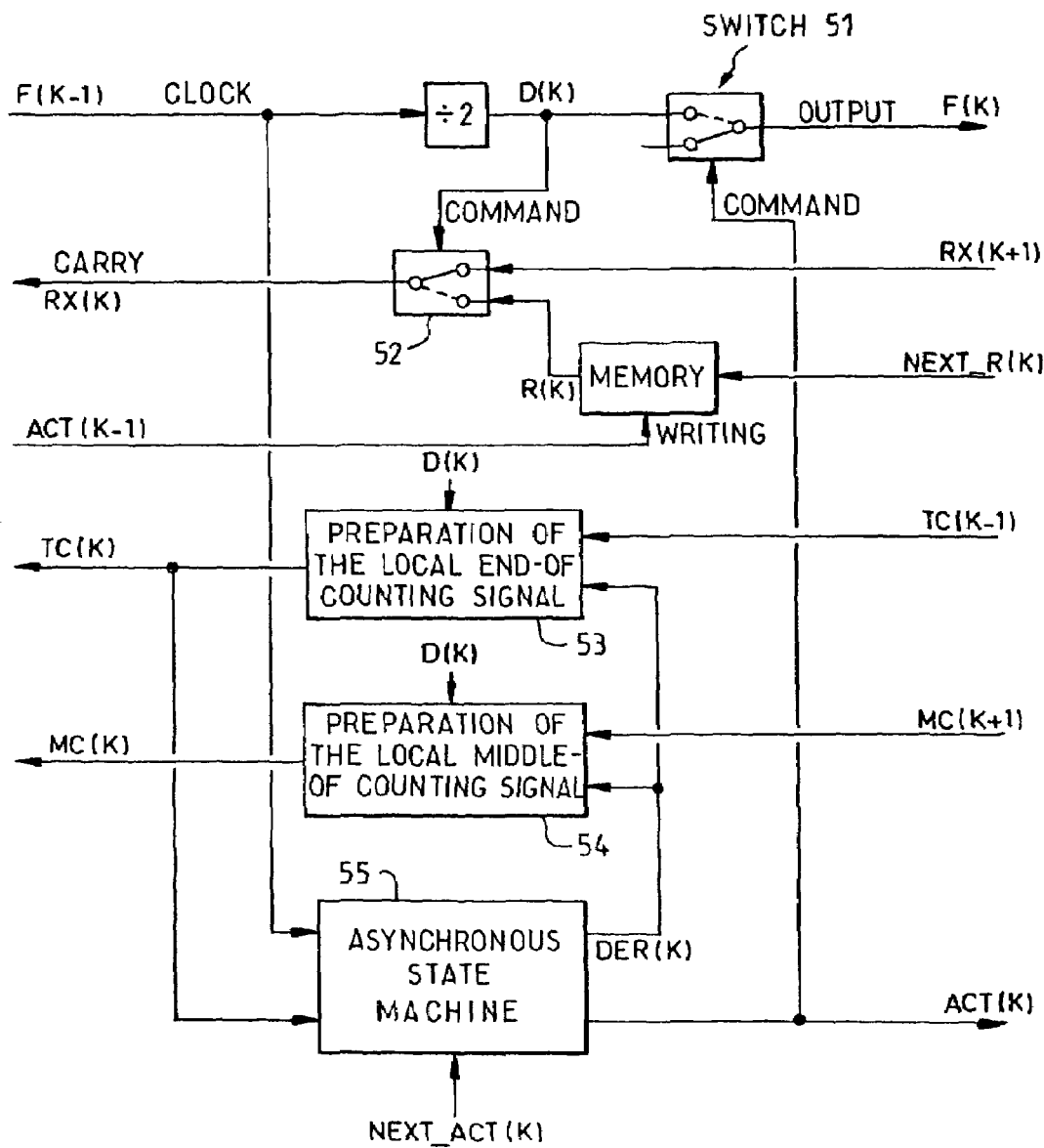
FIG. 11 is a block diagram of an exemplary K-rank stage of the divider according to the invention.

FIG. 11 is a schematic block diagram of a stage placed behind the prescaler. The description is given as an example for the stage indexed K.

The stage K comprises, for example:

A divider by 2 referenced 50 which receives the signal F(K−1) from the previous stage and delivers the divided signal D(K), A switch 51 that receives D(K) at one of its inputs, the other one receiving 0, and that delivers the output signal of the stage K which is given at the next stage, A switch 52 controlled by D(K) so as to transmit alternately at its output named RX(K):

The value of the piece of programming data R(K) for a state of the divider by 2, The value of the carry value RX(K+1) coming from the next stage for the other state of the divider by 2. The carry value RX(K+1) has a duration greater than that of the states of the stage K divider. It is therefore windowed down by the stage K.

A function 53 whose role is to prepare a signal called TC(K) which signifies the end of counting for the stage K. To prepare TC(K), this function uses the signals TC(K+1) (corresponding to the end of counting of the previous stage), D(K) (output of the divider by 2) and the signal DER(K) which means, depending on its value 0 or 1, that the stage K is or is not the last stage.

A function 54 whose role is to prepare a signal called MC(K) which means the middle of counting for the stage K. To prepare MC(K), this function uses the signals MC(K+1) (middle of counting of the next stage), D(K) (output of the divider by 2) and the signal DER(K) which means, depending on its value 0 or 1, that the stage K is or is not the last stage.

An asynchronous state machine 55 comprising one or more storage elements.

A flip-flop circuit 56 for the storage of the local carry value R(K). This flip-flop circuit receives NEXT_R(K) as a data input. The writing of this flip-flop circuit is done by the signal ACT(K−1) coming from the previous stage. For the first stage P+1 of the funnel structure, the signal ACT(P) is the signal TC(P+1).

The asynchronous state machine 55 works with a piece of data which is the NEXT_ACT(K) signal and with two clock signals which are F(K−1) and TC(K). The clock signals set the rate of the succession of the states of the machine as a function of the piece of data NEXT_ACT(K) and as a function of the state of one of more storage flip-flop circuits internal to the machine.

The state machine delivers the signals DER(K) and ACT (K). The signal DER(K) is used to manage the quality of the last stage for the stage K and is used by the functions preparing the signals corresponding to the middle and end of counting of the stage K.

The signal ACT(K) is an activation signal for the next stage. The activation signal controls the switch located at output of the divider by 2. It is also transmitted to the next stage Working of the Stage K The description shall be limited here to the operation of the new functions as compared with the structure previously described in the paragraph on the synchronous output. These new functions are essentially:

The function preparing the end-of-counting function,
The function preparing the mid-counting function,
The asynchronous state machine.

When the stage K is not the last stage, the mid-counting and end-of-counting functions work as in the diagram describing the working of the funnel structure with synchronous output: i.e. TC(K+1) and MC(K+1) are windowed down by the signal D(K) to give TC(K) and MC(K) respectively.

When the stage K is the last stage, it is the signal DER(K) that is windowed down by D(K) and transmitted on MC(K) during the first part of the frame and TC(K) during the second part of the frame.

The asynchronous state machine comprises at least one storage flip-flop circuit ACT(K) that memorizes the active or non-active state of the next stage. The detail of the operating cycle of the state machine described here below is a preferred embodiment given by way of an example.

It is clear that modifications of this operating cycle are possible without changing the spirit of the invention.

Preferred Mode of Operation

At the beginning of the frame, all the flip-flop circuits ACT(K) and all the dividers are at zero and the stage (P+1) is considered to be the last stage.

The first edge of F(K−1) (relative to the start of the frame as defined in the previous paragraph) writes the value NEXT_ACT(K) in the storage flip-flop circuit ACT(K). If and only if the following stage is active, the output ACT(K) of this storage flip-flop circuit prompts the following two events:

1. The output switch transmits the signal D(K) to the output F(K) which is the input of the divider by 2 of the following stage which will therefore, firstly, start counting and, secondly, write the flip-flop circuit ACT(K+1) managing the activity of the stage K+2;

2. The signal ACT(K) writes the storage flip-flop circuit of the carry value R(K+1).

The edge of TC(K) signifying the beginning of the end of counting for the stage K resets the flip-flop-circuit ACT(K).

Thus, when the signal TC makes a trace back along the chain of the stages starting from the last active stage towards the first active stage (which is always P+1), it resets all the flip-flop circuits ACT(K) and therefore opens the switches located between the dividers so as to leave all the dividers in the zero state. At the end of the frame, all the flip-flop circuits ACT(K) and all the dividers have therefore returned to the initial stage and the stage (P+1) is considered to be the last stage.

Advantageously, a dynamic management of the number of active stages is thus obtained: from frame to frame, it is possible to choose any value N between $2^{P+1}$ and $2^{Kmax+1}$.

This alternative embodiment including a simple asynchronous state machine in each stage of the divider makes it possible to obtain a division rank varying from $2^{P+1}$ (maximum division rank of the prescaler) to $2^{Kmax+1}$ (maximum division rank when all the stages of the device are active). This divider also shows optimum consumption because the entire management of the operation works at the speed of the stage concerned and carries out only a limited number of operations per frame (and not per cycle which makes a great difference).

Asynchronous State Machine

Figure 12:
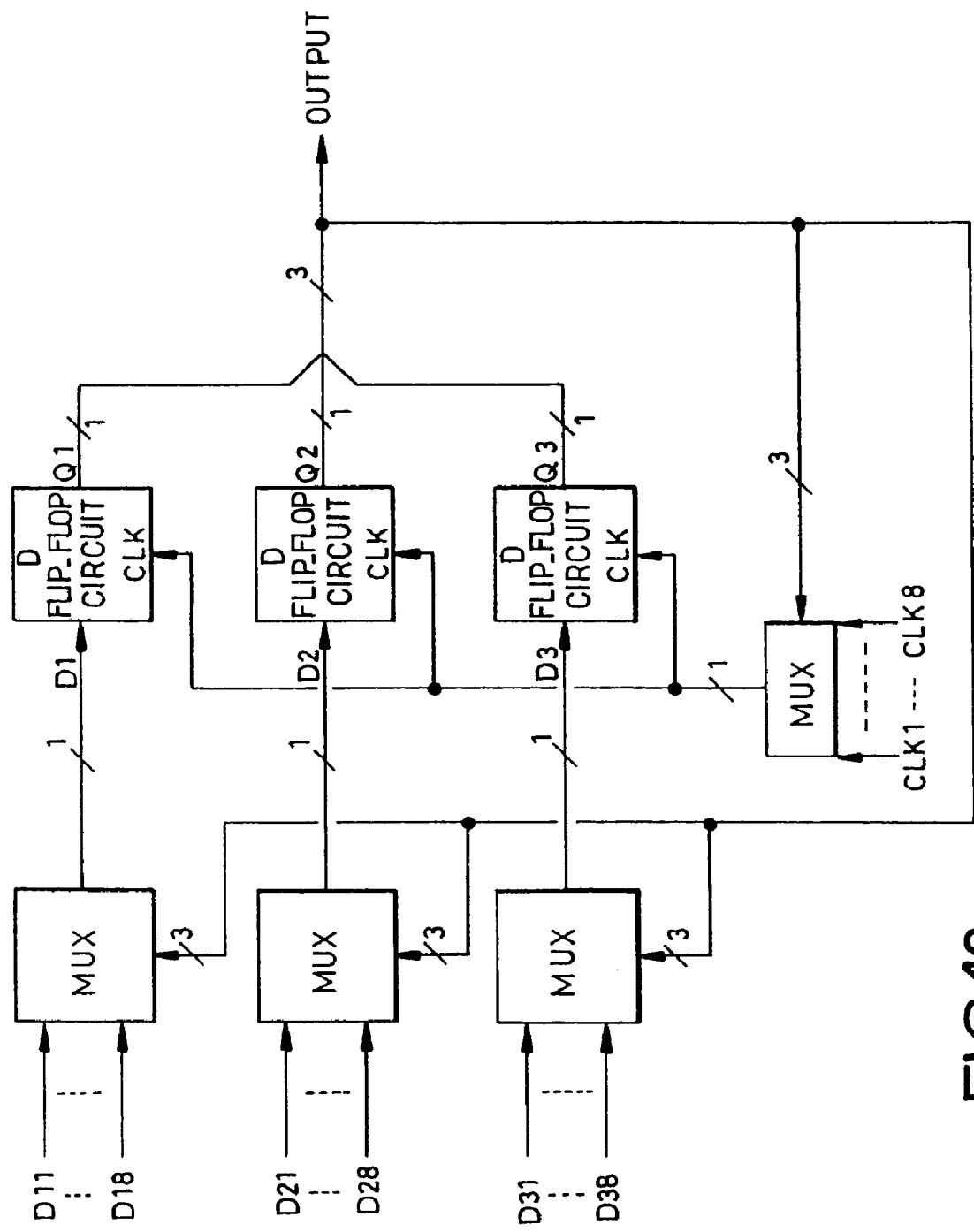
FIG. 12 is a drawing of an eight-state asynchronous state machine.

FIG. 12 is a diagram of an eight-state asynchronous machine, i.e. for N=3.

In its general form, this state machine consists of N D-type flip-flop circuits sharing the same clock input called CLK. A particular N-bit word stored in these D flip-flop circuits represents a state of the machine. There are therefore $2^N$ possible states of the machine.

The input CLK is connected to the output of a $2^N$-position switch that is controlled by the state word of the machine, i.e. by the N-bit bus constituted by the Q outputs of the D flip-flop circuits.

The $2^N$ inputs of this switch are the $2^N$ clock signals which set the rate of the succession of the states of the machine. Each D input of each flip-flop circuit is also connected to the output of a switch with $2^N$ inputs which is controlled by the N output-bits bus of the machine. Since there are N flip-flop circuits, there are N input switches each of which has $2^N$ inputs. There is therefore a total of $N*2^N$ data inputs for the machine.

Figure 13:
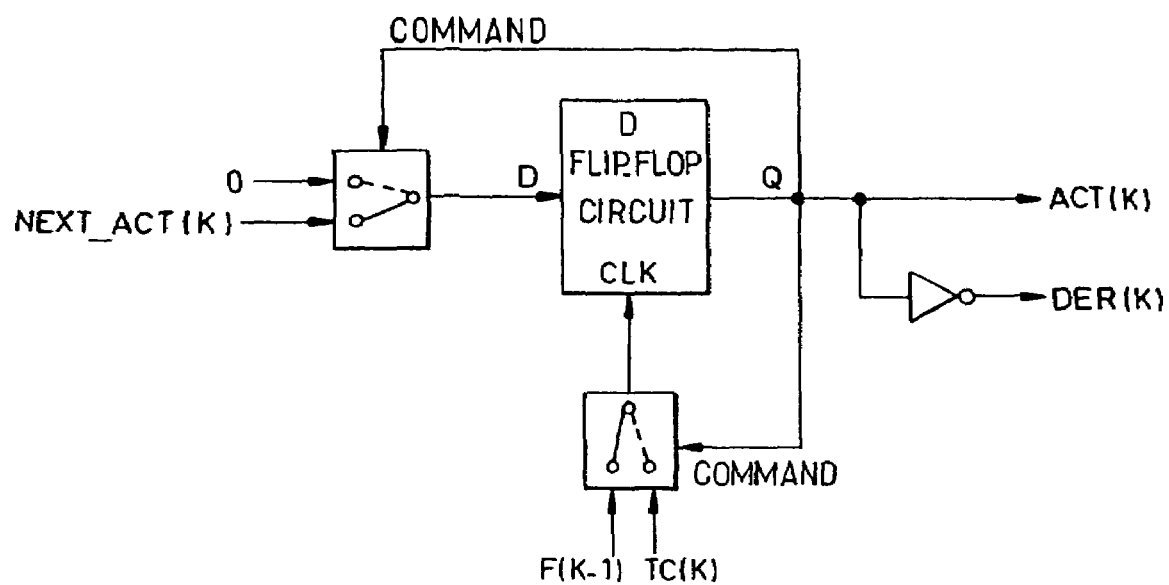
FIG. 13 is a drawing of the asynchronous state machine for the stage K of the frequency divider according to the invention.

FIG. 13 is a diagram of the state machine for the frequency divider application. There is only one D type flip-flop circuit.

The clock inputs are F(K−1) and TC(K).
The data inputs are NEXT_ACT(K) and 0.
The Q output of the D flip-flop circuit controls the two switches located on D and on CLK.
The output ACT(K) is the Q output.
The output DER(K) is the complement of Q.
When Q is at 0, the clock is F(K−1) and the data is NEXT_ACT(K)⇒the first edge of F(K−1) writes the value ACT(K). When Q is at 1, the clock is TC(K) and the data is 0⇒ the first edge of TC(K) resets the D flip-flop circuit.

What is claimed is:

1. A frequency divider enabling the division by N of a frequency Fe and comprising at least one prescaler followed by a division chain, wherein:
   the prescaler has at least one input for the frequency signal Fe to be divided, one input for a command NA of a basic division rank of the prescaler and one input for a command □NA coming from the division chain and enabling NA to be made to vary by one unit,
   the division chain comprises at least one division stage (K) comprising at least one divider by 2, giving a divided frequency F(K), a switch controlled by the divider by 2, the switch having one input for a piece of programming data R(K), one input for a carry signal RX(K+1) of the next stage and one output for a carry signal RX(K) for the previous stage.

2. The frequency divider according to claim 1 wherein the command NA varies from 2* N0 to 2* N0−1 wherein N0 is the minimum rank of the prescaler.

3. The frequency divider according to claim 2 wherein the command NA (NA+1) varies from $2^P$ to $2^{(P+1)}-1$.

4. The frequency divider according to claim 1 comprising a first chain of switches controlled by outputs F(K) of the dividers and giving a signal MC(P+1), a second chain of switches controlled by the outputs F(K) of the dividers and giving a signal TC(P+1) and a unit for the generation of a synchronous output prepared from the signals TC(P+1), MC(P+1) and an input signal F(P) or output signal Fe of the prescaler.

5. The frequency divider according to claim 4 wherein a generation module is a JK type flip-flop circuit that receives the signals MC(P+1) and TC(P+1) and Fe or F(P).

6. The frequency divider according to claim 4 comprising at least one second chain of switches controlled by the outputs F(K) of the dividers and giving the signal TC(P+1), at least two switches receiving the signal TC(P+1) and giving two signals to a flip-flop circuit receiving the input signal or the output signal of the prescaler.

7. The frequency divider according to claim 4 comprising a first row of registers controlled by intermediate outputs of the chain TC and a second row of registers controlled by the signal MC(P+1).

8. The frequency divider according to claim 4, comprising:
   a function for taking into account in mid-frame of division rank for a next frame, this function receiving a write signal MC(P+1),
   a function preparing the signal for taking account of a new division rank NA of the prescaler,
   a decoding function 44 enabling a extraction of the pieces of information NEXT_R(K), NEXT_ACT(K) and NEXT_NA from a control word N.

9. The frequency divider according to claim 8, comprising a function for taking account of polarity of the synchronous output signal for the next frame.

10. The use of the divider according to claim 1 in the field of phase-locked loop frequency synthesis.

11. The use of the divider according to claim 1 for a pulse generator.

* * * * *